(12) United States Patent
Choung et al.

(10) Patent No.: US 9,634,037 B2
(45) Date of Patent: Apr. 25, 2017

(54) ARRAY SUBSTRATE FOR DISPLAY DEVICES

(71) Applicant: Samsung Display Co. Ltd., Yongin, Gyeonggi-Do (KR)

(72) Inventors: Jong Hyun Choung, Hwaseong-si (KR); Bong Kyun Kim, Hwaseong-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/698,341

(22) Filed: Apr. 28, 2015

(65) Prior Publication Data

US 2016/0181279 A1  Jun. 23, 2016

(30) Foreign Application Priority Data

Dec. 23, 2014 (KR) .................. 10-2014-0187279

(51) Int. Cl.
H01L 27/12 (2006.01)

(52) U.S. Cl.
CPC ........ H01L 27/1244 (2013.01); H01L 27/124 (2013.01)

(58) Field of Classification Search
CPC .......................... H01L 27/124; H01L 27/1244
See application file for complete search history.

(56) References Cited

U.S. PATENT DOCUMENTS

| | | | | |
|---|---|---|---|---|
| 2005/0094082 A1* | 5/2005 | Kim | ...................... | G02F 1/1393 349/145 |
| 2008/0042956 A1* | 2/2008 | Hur | ................... | G02F 1/133707 345/92 |
| 2011/0012821 A1* | 1/2011 | Ogura | ............... | G02F 1/133784 345/87 |
| 2011/0261307 A1* | 10/2011 | Shin | .................. | G02F 1/133753 349/123 |
| 2012/0127148 A1* | 5/2012 | Lee | .................... | G02F 1/134363 345/212 |
| 2012/0274885 A1* | 11/2012 | Shin | .................. | G02F 1/133707 349/110 |

FOREIGN PATENT DOCUMENTS

| | | |
|---|---|---|
| KR | 1993-0022125 B1 | 11/1993 |
| KR | 2001-0063498 A | 7/2001 |
| KR | 2005-0030273 A | 3/2005 |
| KR | 2006-0014089 A | 2/2006 |
| KR | 2007-0052071 A | 5/2007 |
| KR | 2008-0049446 A | 6/2008 |

* cited by examiner

*Primary Examiner* — Douglas Menz
(74) *Attorney, Agent, or Firm* — Innovation Counsel LLP

(57) ABSTRACT

An array substrate for display devices is provided. According to an exemplary embodiment, the array substrate for display device includes: a plurality of gate lines that extend along a first direction; and a data line that is formed by connecting a plurality of first sub-data lines extending along a second direction and a plurality of second sub-data lines extending along a third direction, wherein the gate lines overlap the second sub-data lines with an insulating layer interposed therebetween.

14 Claims, 13 Drawing Sheets

ARRAY SUBSTRATE FOR DISPLAY DEVICES

This application claims priority from Korean Patent Application No. 10-2014-0187279 filed on Dec. 23, 2014 in the Korean Intellectual Property Office, the disclosure of which is incorporated herein by reference in its entirety.

BACKGROUND

1. Related Field

The present disclosure relates to an array substrate for display devices.

2. Description of the Related Art

With the development of multimedia, the importance of display devices is increasing. Accordingly, various types of display devices, such as liquid crystal displays (LCDs) and organic electroluminescent display devices, are being used.

In an LCD, an electric field is applied to a liquid crystal material injected between two substrates and having negative dielectric anisotropy. The LCD adjusts the amount of light (from an external light source) that is transmitted through the substrates by controlling the intensity of the electric field, thereby obtaining a desired image signal.

Generally, an organic electroluminescent display device emits light by electrically exciting a fluorescent organic compound. The organic electroluminescent display device may display an image by driving a plurality of organic light-emitting diodes (OLEDs) arranged in a matrix using voltage programming or current programming Methods of driving the organic electroluminescent display device include a passive matrix method or an active matrix method using thin-film transistors (TFTs). In the passive matrix method, anodes and cathodes are formed to be orthogonal to each other, and lines are selected to be driven. On the other hand, in the active matrix method, a TFT is connected to each indium tin oxide (ITO) pixel electrode and driven according to a voltage maintained by the capacitance of a capacitor connected to a gate of the TFT.

In the above-described LCD or organic electroluminescent display device, signal lines including gate lines and data lines are typically formed on an array substrate, and pixels are formed at the intersections of the gate lines and the data lines. In addition, each pixel is connected to a gate line and a data line using a TFT as a switching device.

To produce a large display device and reduce the resistance of each signal line formed on the array substrate of the display device, attempts have been made to increase the thickness of the signal lines.

However, the thick signal lines disposed on the array substrate may erode or, worse, break in regions where the lines overlap each other.

SUMMARY

Aspects of the present system and method provide an array substrate for display devices that is capable of minimizing the effect of a defect such as erosion or breakage in a region where a gate line and a data line overlap each other.

Aspects of the present system and method also provide an array substrate for display devices that is capable of minimizing the effect of a defect such as erosion or breakage in a region where a semiconductor layer and a gate electrode overlap each other.

Aspects of the present system and method also provide an array substrate for display devices that is capable of minimizing the effect of a defect such as erosion or breakage in a region where various lines overlap each other.

However, aspects of the present system and method are not restricted to the ones set forth herein. The above and other aspects of the present system and method will become more apparent to one of ordinary skill in the art to which the present system and method pertains by referencing the detailed description below.

According to an aspect of the present system and method, there is provided an array substrate for display devices. The array substrate for display device includes: a plurality of gate lines that extend along a first direction; and a data line that is formed by connecting a plurality of first sub-data lines extending along a second direction and a plurality of second sub-data lines extending along a third direction, wherein the gate lines overlap the second sub-data lines with an insulating layer interposed therebetween.

According to another aspect of the present system and method, there is provided an array substrate for display device. The array substrate comprising: a plurality of gate lines that extend along a first direction; a plurality of data lines that extend along a second direction; a plurality of pixels that are formed in regions surrounded by the gate lines and the data lines; and a plurality of switching transistors that connect the gate lines, the data lines and the pixels, wherein each of the switching transistors comprises: a source electrode that is connected to one of the data lines; a drain electrode that is connected to one of the pixels; a gate electrode that is connected to one of the gate lines and extends along a third direction; and a semiconductor layer that connects the source electrode and the drain electrode, overlaps the gate electrode, and extends along a fourth direction.

According to the exemplary embodiments disclosed herein, it is possible to minimize the effect of a defect such as erosion or breakage in a region where a gate line and a data line overlap each other on an array substrate for display devices.

It is also possible to minimize the effect of a defect such as erosion or breakage in a region where a semiconductor layer and a gate electrode overlap each other on an array substrate for display devices.

It is also possible to minimize the effect of a defect such as erosion or breakage in a region where various lines overlap each other on an array substrate for display devices.

Other features and exemplary embodiments will be apparent from the following detailed description, the drawings, and the claims.

BRIEF DESCRIPTION OF THE DRAWINGS

The above and other aspects and features of the present system and method will become more apparent when the exemplary embodiments disclosed herein are considered with reference to the attached drawings, in which.

DETAILED DESCRIPTION

The present system and method are described more fully hereinafter with reference to the accompanying drawings in which exemplary embodiments of the present system and method are shown. The present system and method may, however, be embodied in different forms and are not limited to the embodiments set forth herein. Rather, these embodiments are provided facilitate those of ordinary skill in the art to understand the present system and method. The same reference numbers refer to the same components throughout the specification. In the attached figures, the thickness of layers and regions is exaggerated for clarity.

Although the terms first, second, third, etc., may be used herein to describe various elements, these elements are not limited by these terms. These terms are only used to distinguish one element from another element. Thus, a first element discussed below may be referred to as a second element without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." The term "and/or" may be used herein with an associated list of items and, in such cases, refers to any and all combinations of one or more of the associated list of items. When used in this specification, the terms "comprises" and/or "comprising," or "includes" and/or "including" specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. In whichever way the device may be otherwise oriented (e.g., rotated 90 degrees or at other orientations), the spatially relative descriptors used herein are to be interpreted accordingly.

Exemplary embodiments are hereinafter described with reference to the accompanying drawings.

Figure 1:
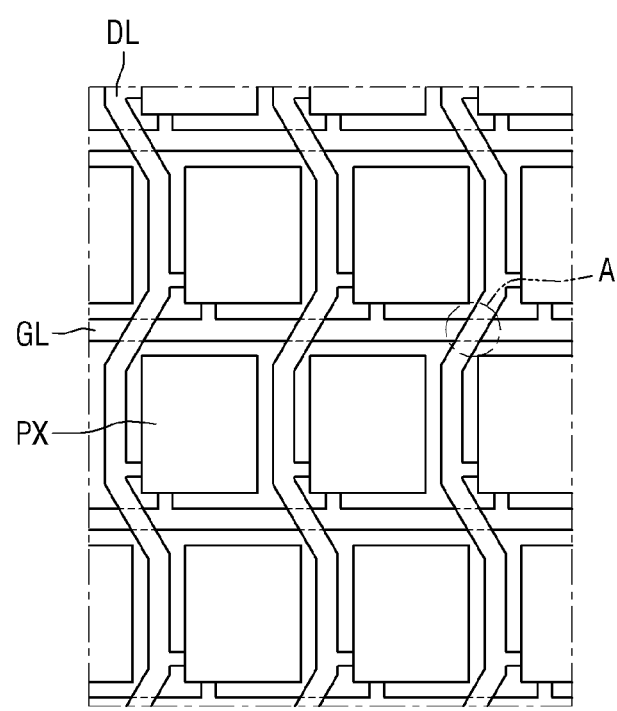
FIG. 1 is a plan view of an array substrate for display devices according to an embodiment of the present system and method.

FIG. 1 is a plan view of an array substrate for display devices according to an embodiment of the present system and method.

Referring to FIG. 1, the array substrate may include a plurality of gate lines GL, a plurality of data lines DL, and a plurality of pixels PX.

The gate lines GL may be formed on the array substrate to extend along a first direction. In addition, the gate lines GL may receive gate signals from an external source and provide the gate signals to the pixels PX. Each of the pixels PX may be turned on or off by a gate signal provided.

The data lines DL may be formed on the array substrate to extend along a second direction or a third direction. In addition, the data lines DL may receive data signals from an external source and provide the data signals to the pixels PX. A color displayed on each of the pixels PX may be determined by a data signal provided.

The gate lines GL and the data lines DL may be insulated from each other by an interlayer insulating film (not illustrated). There may be regions in which the gate lines GL and the data lines DL overlap each other with the interlayer insulating film (not illustrated) interposed therebetween.

In the regions where the gate lines GL and the data lines DL overlap each other, the data lines DL may extend in the third direction different from the first direction and the second direction. This is described in detail later with reference to FIGS. 2 through 5.

Each of the pixels PX may display a color in response to a gate signal and a data signal provided. If each of the pixels PX is a current writing pixel, the data signal may be a current. If each of the pixels PX is a voltage writing pixel, the data signal may be a voltage.

To implement color display, each of the pixels PX may uniquely display one of a plurality of primary colors such that the spatial sum of the primary colors is recognized as a desired color, or alternately display the primary colors over time such that the temporal sum of the primary colors is recognized as the desired color. The primary colors may be, for example, red, green and blue. To display a color as the temporal sum of the primary colors, red, green and blue may be alternately displayed on one pixel PX over time. To display a color as the spatial sum of the primary colors, a red pixel, a green pixel and a blue pixel may be arranged alternately in a row or column direction, or the three pixels may be arranged at locations corresponding to three vertices of a triangle.

Figure 2:
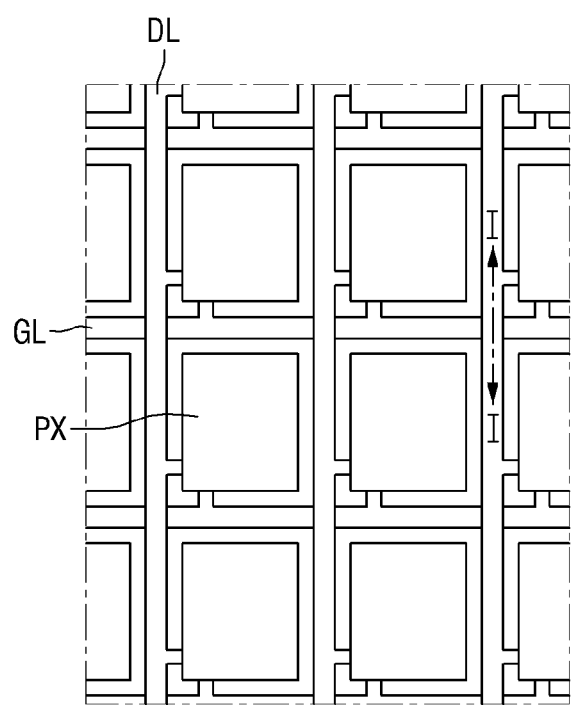
FIG. 2 is a plan view of an array substrate for display devices according to a comparative example.

FIG. 2 is a plan view of an array substrate for display devices according to a comparative embodiment of FIG. 1.

Elements of FIG. 2 are identical to those of FIG. 1 except for some elements illustrated differently from FIG. 1, and thus a description of the identical elements is omitted.

Referring to FIG. 2, unlike the data lines DL illustrated in FIG. 1, data lines DL of FIG. 2 extend along the first direction without being bent in regions where the gate lines GL and the data lines DL overlap each other. That is, the data lines DL of FIG. 2 do not extend along a third direction in these regions.

In this case, the data lines DL may erode or, worse, break depending on the thickness of each of the gate lines GL. This is described in detail with reference to FIGS. 3 and 4.

Figure 3:
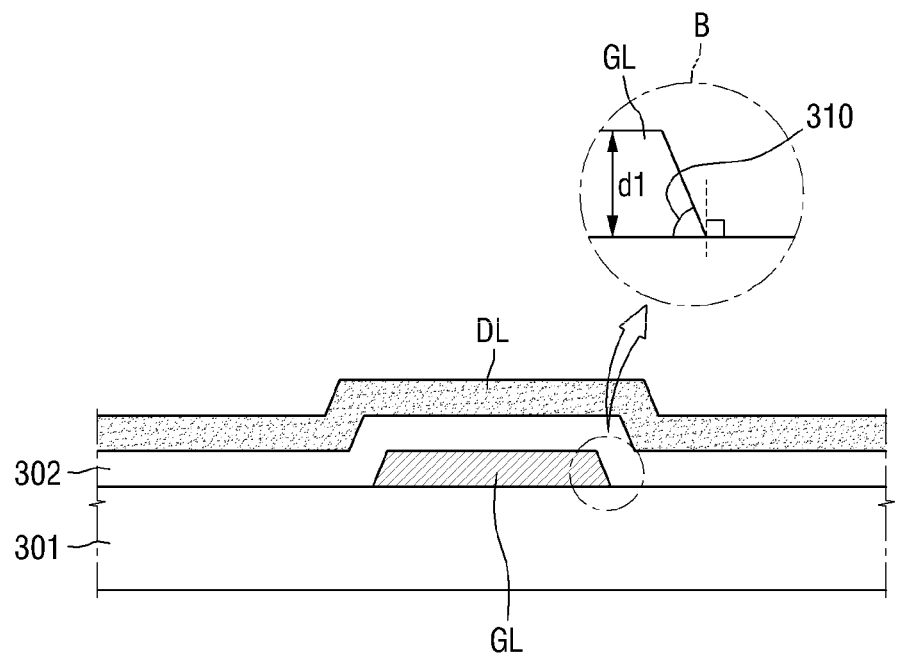
FIG. 3 is an exemplary cross-sectional view of a region I-I' of FIG. 2.
Figure 4:
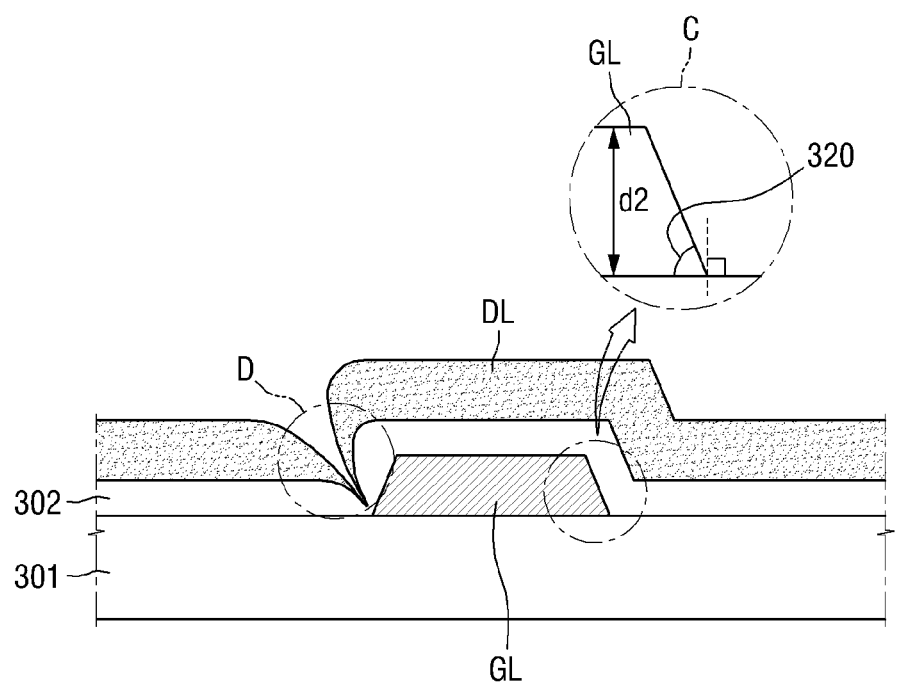
FIG. 4 is another exemplary cross-sectional view of the region I-I' of FIG. 2.

FIG. 3 is an exemplary cross-sectional view of a region I-I' of FIG. 2. FIG. 4 is another exemplary cross-sectional view of the region I-I' of FIG. 2.

Referring to FIG. 3, a gate line GL, an insulating layer 302, and a data line DL may be sequentially stacked on a substrate 301. Specifically, the gate line GL may be formed by forming a gate line layer and patterning the gate line layer. After the insulating layer 302 is formed on the gate line GL, the data line DL may be formed by forming a data line layer on the insulating layer 302 and patterning the data line layer. However, the present system and method are not limited thereto, and other types of lines, insulating layers and elements of the array substrate may be formed on the substrate 301.

Referring to an enlarged view of a region 'B' around a side surface of the gate line GL, when the gate line GL has a thickness of d1, an angle of inclination formed by the side surface of the gate line GL and the substrate 301 may be a first angle 310.

To produce a large display device and reduce the resistance of each line formed on the substrate 301, attempts have been made to form the lines with an increased thickness as described above. Referring to FIG. 4, the gate line GL may have the increased thickness of d2. Since the thickness of the gate line GL is increased from d1 to d2, the angle of inclination formed by the side surface of the gate line GL and the substrate 301 may be a second angle 320 that is greater than the first angle 310 illustrated in FIG. 3.

However, to form the insulating layer 302 and the data line DL on the gate line GL after the formation of the gate line GL, many processes including an array process, a cleaning process, a rubbing process and a sputtering process may be performed. Various lines and insulating layers formed on the substrate 301 may inevitably be damaged during these processes.

As the angle of inclination formed by the side surface of the gate line GL and the substrate 301 increases, the insulating layer 302 and the data line DL formed on the gate line GL are more likely to become damaged, resulting in erosion that may unnecessarily increase the resistance of the data line DL. Even worse, the data line DL may break as shown in a region 'D' of FIG. 4.

However, if the data line DL is bent in the third direction different from the first direction and the second direction in a region where the gate line GL and the data line DL overlap each other, such as shown in FIG. 1, erosion or breakage can be prevented. This prevention mechanism is described in detail with reference to FIG. 5.

Figure 5:
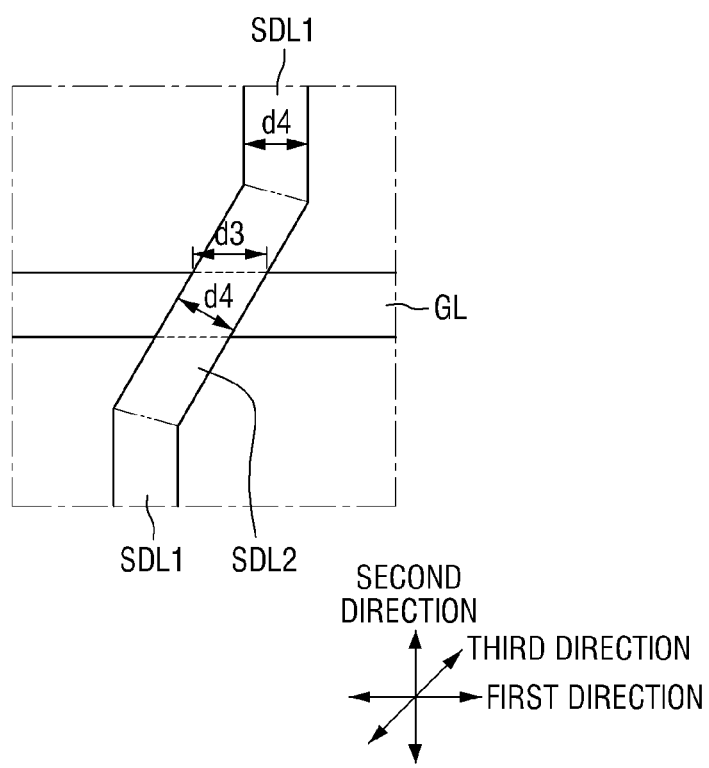
FIG. 5 is an enlarged plan view of a region 'A' of FIG. 1 according to an embodiment of the present system and method.

FIG. 5 is an enlarged plan view of a region 'A' of FIG. 1 according to an embodiment of the present system and method.

Referring to FIG. 5, a data line DL may include a first sub-data line SDL1 extending along the second direction and a second sub-data line SDL2 extending along the third direction. The third direction may be oblique, not perpendicular, to the first direction and the second direction.

A gate line GL may overlap the second sub-data line SDL2. In this case, of the boundary lines formed between the gate line GL and the second sub-data line SDL2, a boundary line on the side of the second sub-data line SDL2 may have a length of d3.

If the gate line GL overlaps the first sub-data line SDL1, such as may occur in the comparative example of FIG. 2, of the boundary lines formed between the gate line GL and the first sub-data line SDL, a boundary line on the side of the first sub-data line SDL1 may have a length of d4 that is equal to a width of the first sub-data line SDL1. Here, however, in the case of FIG. 5, d4 may have a smaller value than d3.

That is, when the gate line GL overlaps the second sub-data line SDL2, a longer boundary line can be formed than when the gate line GL overlaps the first sub-data line SDL1.

Accordingly, even if the second sub-data line SDL2 is partially eroded or broken along the boundary line between the gate line GL and the second sub-data line SDL2, since the second sub-data line SDL2 overlaps more of the gate line GL, the effect of the erosion or breakage on the resistance value of the data line DL may be negligible. This ensures a safer design than when the gate line GL and the first sub-data line SDL1 overlap each other.

Figure 6:
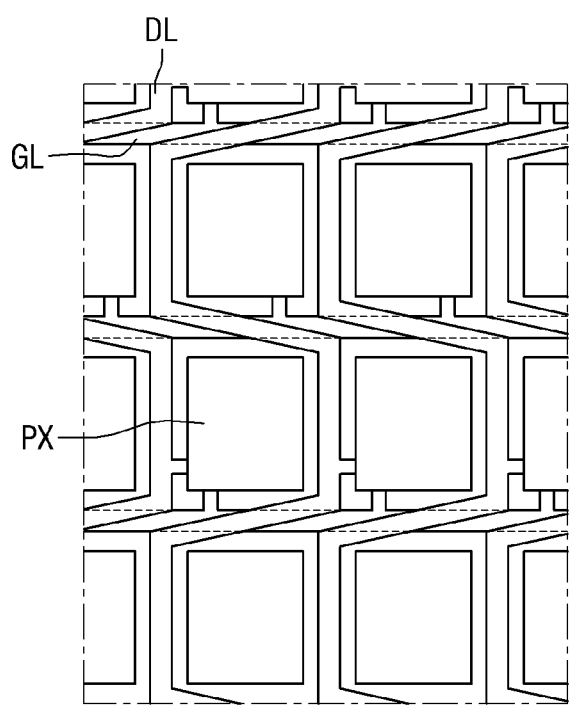
FIG. 6 is a plan view of an array substrate for display devices according to another embodiment of the present system and method.

FIG. 6 is a plan view of an array substrate for display devices according to another embodiment of the present system and method.

Referring to FIG. 6, the length of each data line DL extending along the third direction may be greater than the length of a side surface of each pixel PX.

In this case, an included angle formed by the third direction and the second direction in which gate lines GL extend may be smaller than that of FIG. 4. The smaller included angle may increase the length of a boundary line formed between a data line DL and a gate line GL overlapping each other. Accordingly, this can reduce a significant increase in the resistance value of the data line DL due to erosion or breakage.

Figure 7:
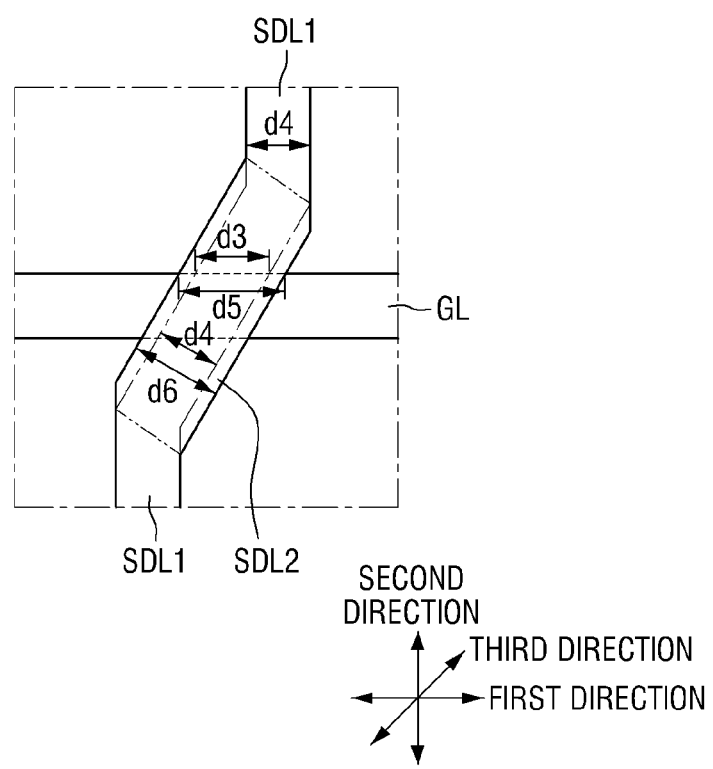
FIG. 7 is an enlarged plan view of the region 'A' of FIG. 1 according to another embodiment of the present system and method.

FIG. 7 is an enlarged plan view of the region 'A' of FIG. 1 according to another embodiment of the present system and method.

Elements of FIG. 7 are identical to those of FIG. 5 except for some elements illustrated differently from FIG. 5, and thus a description of the identical elements is omitted.

Referring to FIG. 7, a first sub-data line SDL1 of FIG. 7 is identical to the first sub-data line SDL1 of FIG. 5. However, a second sub-data line SDL2 of FIG. 7 may have a different width from the second sub-data line SDL2 of FIG. 5. For ease of description, a portion corresponding to the second sub-data line SDL2 of FIG. 5 is indicated by an alternating long and short dash line in FIG. 7.

That is, the second sub-data line SDL2 of FIG. 7 may have a width of d6 that is greater than the width d4 of the second sub-data line SDL2 of FIG. 5. Therefore, a boundary line formed between the second sub-data line SDL2 and a gate line GL of FIG. 7 may have a length of d5 that has a greater value than the length d3 of the boundary line formed between the second sub-data line SDL2 and the gate line GL in FIG. 5.

Therefore, since the length of the boundary line formed between a data line DL and the gate line GL overlapping each other is increased, a significant increase in the resistance value of the data line DL due to erosion or breakage can be prevented.

Figure 8:
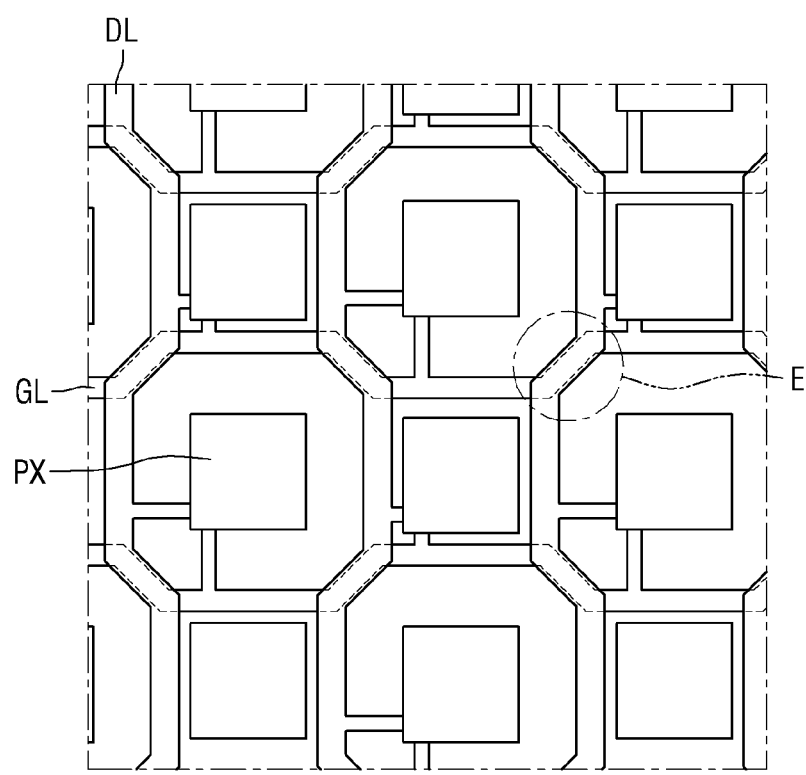
FIG. 8 is a plan view of an array substrate for display devices according to another embodiment of the present system and method.

FIG. 8 is a plan view of an array substrate for display devices according to another embodiment of the present system and method.

Elements of FIG. 8 are identical to those of FIG. 1 except for some elements illustrated differently from FIG. 1, and thus a description of the identical elements is omitted.

Referring to FIG. 8, unlike the gate lines GL illustrated in FIG. 1, gate lines GL of FIG. 8 may also extend in a direction other than the first direction. A portion of each gate line GL that extends in a direction other than the first direction may overlap a portion of each data line DL that extends in a direction other than the second direction.

This structure is now described in detail with reference to FIG. 9.

Figure 9:
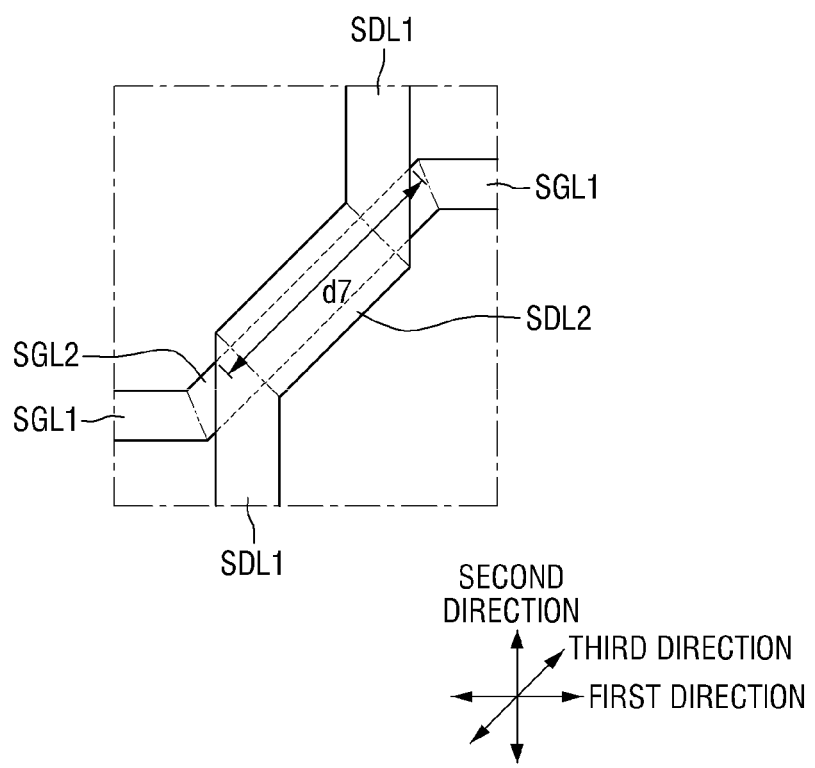
FIG. 9 is an enlarged plan view of a region 'E' of FIG. 8 according to an embodiment of the present system and method.

FIG. 9 is an enlarged plan view of a region 'E' of FIG. 8 according to an embodiment of the present system and method.

Elements of FIG. 9 are identical to those of FIG. 5 except for some elements illustrated differently from FIG. 5, and thus a description of the identical elements is omitted.

Referring to FIG. 9, unlike the gate line GL of FIG. 5, a gate line GL may include a first sub-gate line SGL1 extending along the first direction and a second sub-gate line SGL2 extending along the third direction. The third direction may be oblique, not perpendicular, to the first direction and the second direction.

The gate line GL and a data line DL may overlap each other. Particularly, a second sub-data line SDL2 and the second sub-gate line SGL2 may overlap each other.

In addition, the second sub-data line SDL2 may be wider than the second sub-gate line SGL2. In this case, the second sub-data line SDL2 may cover the second sub-gate line SGL2. Therefore, a boundary line formed between the second sub-data line SDL2 and the second sub-gate line SGL2 overlapping each other may have a length of d7. Therefore, a significant increase in the resistance vale of the data line DL due to erosion or breakage can be prevented.

Figure 10:
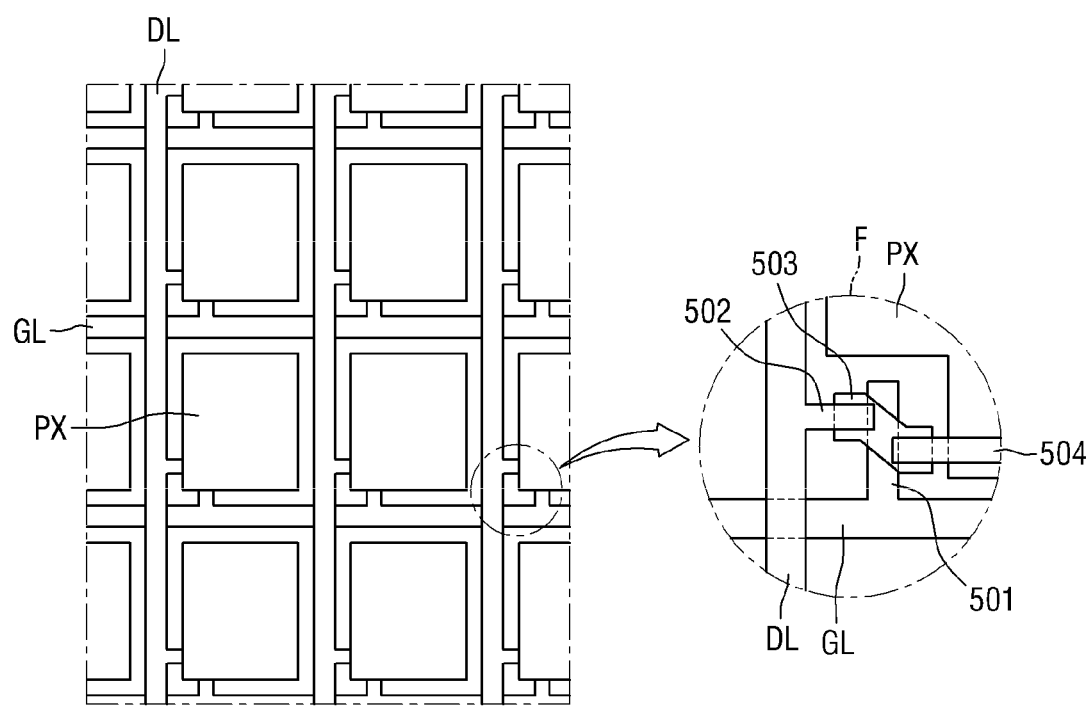
FIG. 10 is a plan view of an array substrate for display devices according to another embodiment of the present system and method.

FIG. 10 is a plan view of an array substrate for display devices according to another embodiment of the present system and method.

Elements of FIG. 10 are identical to those of FIG. 1 except for some elements illustrated differently from FIG. 1, and thus a description of the identical elements is omitted.

Referring to FIG. 10, the array substrate for display devices may further include a plurality of switching transistors, each connecting a gate line GL, a data line DL, and a pixel PX.

Each of the switching transistors may include a data electrode 502 that is connected to the data line DL, a drain electrode 504 that is connected to the pixel PX, a gate electrode 501 that is connected to the gate line GL, and a semiconductor layer 503 that connects the data electrode 502 and the drain electrode 504 and overlaps the gate electrode 501.

Here, the gate electrode 501 and the semiconductor layer 503 may be formed in directions not perpendicular to each other and may obliquely overlap each other. This structure is now described in more detail with reference to FIGS. 11 and 12.

Figure 11:
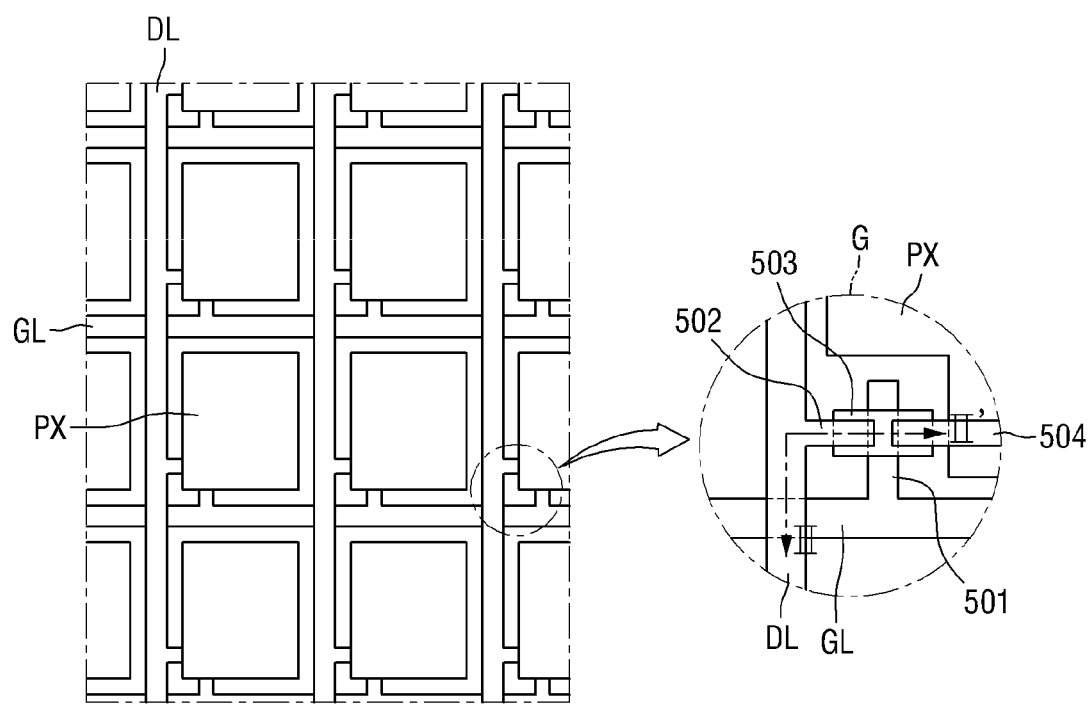
FIG. 11 is a plan view of an array substrate for display devices according to a comparative example.

FIG. 11 is a plan view of an array substrate for display devices according to a comparative example.

Elements of FIG. 11 are identical to those of FIG. 10 except for some elements illustrated differently from FIG. 10, and thus a description of the identical elements is omitted.

Referring to FIG. 11, unlike the semiconductor layer 503 illustrated in FIG. 10, a semiconductor layer 503 may extend in the first direction without being bent in a region where a gate electrode 501 and the semiconductor layer 503 overlap each other.

In this case, the semiconductor layer 503 may erode or, worse, break depending on the thickness of the gate electrode 501. This defect is now described in detail with reference to FIG. 12.

Figure 12:
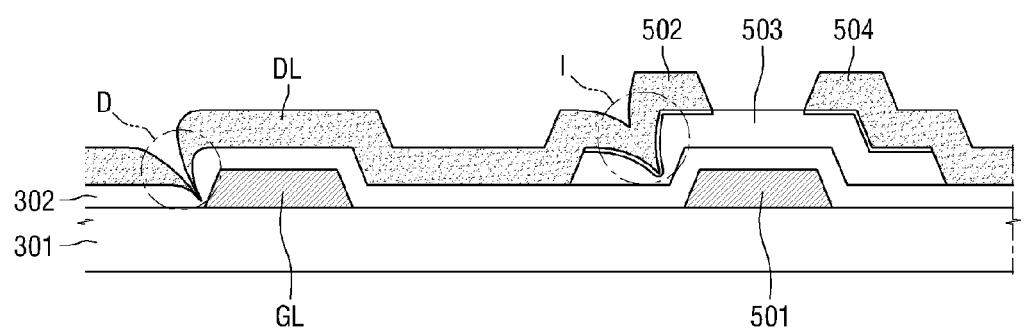
FIG. 12 is an exemplary cross-sectional view of a region II-IF of FIG. 11.

FIG. 12 is an exemplary cross-sectional view of a region II-IF of FIG. 11.

Referring to FIG. 12, the gate electrode 501, an insulating layer 302, the semiconductor layer 503, a data electrode 502, and a drain electrode 504 may be sequentially stacked on a substrate 301. Here, as the thickness of the gate electrode 501 increases, an angle of inclination formed by a side surface of a gate line GL and the substrate 301 increases. In addition, as the angle of inclination formed by the side surface of the gate line GL and the substrate 301 increases, a greater damage may be caused to the insulating layer 302, the semiconductor layer 503, the data electrode 502 and the drain electrode 504 formed on the gate electrode 501. Therefore, resistance may unnecessarily increase due to erosion of the semiconductor layer 503. Even worse, the semiconductor layer 503 may break.

However, if the semiconductor layer 503 is formed oblique to the gate electrode 501 in the region in which the gate electrode 501 and the semiconductor layer 503 overlap each other, such as illustrated in FIG. 10, erosion or breakage can be prevented.

Figure 13:
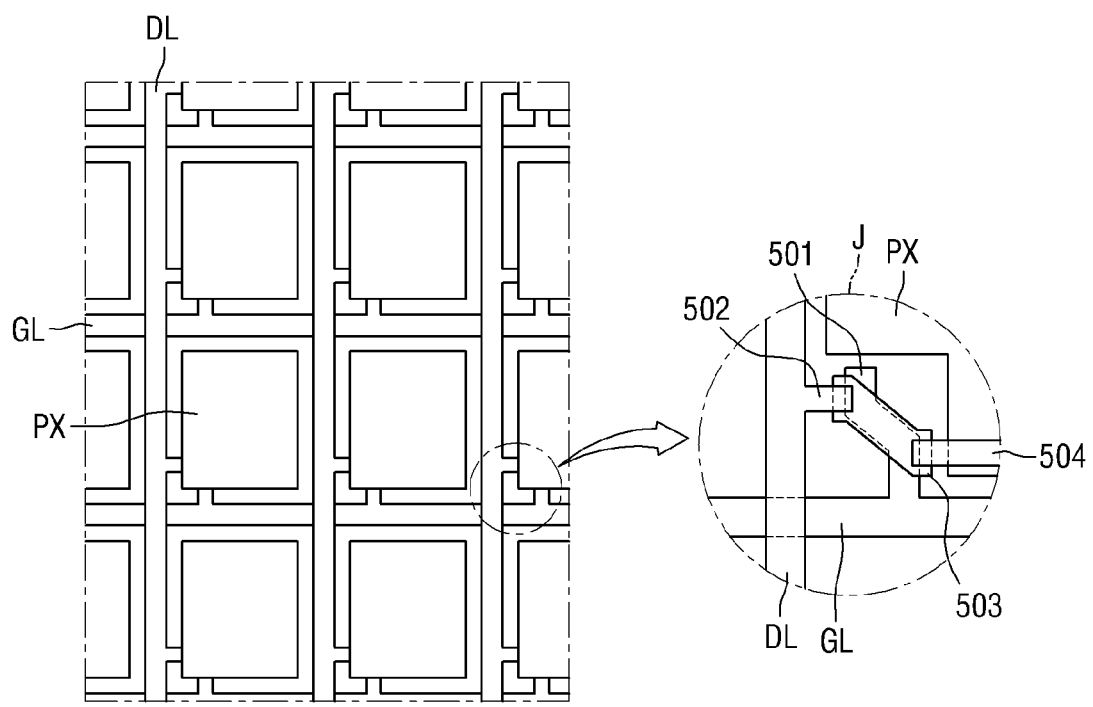
FIG. 13 is a plan view of an array substrate for display devices according to another embodiment of the present system and method.

FIG. 13 is a plan view of an array substrate for display devices according to another embodiment of the present system and method.

Elements of FIG. 13 are identical to those of FIG. 10 except for some elements illustrated differently from FIG. 10, and thus a description of the identical elements is omitted.

Referring to FIG. 13, unlike in the array substrate illustrated in FIG. 10, in the array substrate of FIG. 13, not only a semiconductor layer 503 but also a gate electrode 501 may be bent in a direction other than the first direction and the second direction.

In particular, in a region where the gate electrode 501 and the semiconductor layer 503 overlap each other, the gate electrode 501 may be formed in the same direction as the semiconductor layer 503. Accordingly, a length of a boundary line formed between the semiconductor layer 503 and the gate electrode 501 overlapping each other can be maximized, thereby preventing an abrupt increase in the resistance value of the semiconductor layer 503 due to erosion or preventing breaking of the semiconductor layer 503. The principles behind this are as described above with reference to FIG. 9.

While the structures of a region where a gate line GL and a data line DL intersect each other have been described above as exemplary embodiments of the present system and method, the present system and method are not limited thereto. The structures described herein are also applicable to any other lines that would otherwise perpendicularly overlap each other with an insulating layer disposed therebetween in an array substrate for display devices.

While the system and method are described herein with reference to exemplary embodiments thereof, those of ordinary skill in the art would understand that various changes and modifications may be made without departing from the spirit and scope of the present system and method. The exemplary embodiments should be considered in a descriptive sense only and not for purposes of limitation.

What is claimed is:

1. An array substrate for display devices, the array substrate comprising:
   a plurality of gate lines that extend along a first direction; and
   a data line that is formed by connecting a plurality of first sub-data lines extending along a second direction, a plurality of second sub-data lines extending along a third direction, and a plurality of third-sub-data lines extending along a fourth direction, wherein the first direction and the second direction are perpendicular to each other, and wherein odd-numbered gate lines overlap the second sub-data lines with an insulating layer interposed therebetween, and even-numbered gate lines overlap the third sub-data lines with an insulating layer interposed therebetween.

2. The array substrate of claim 1, wherein an included angle formed between the second direction and the third direction is equal to an included angle formed between the second direction and the fourth direction.

3. The array substrate of claim 1, wherein a width of each of the second sub-data lines is equal to a width of each of the first sub-data lines.

4. The array substrate of claim 1, wherein the third and fourth directions are oblique to the first direction and the second direction.

5. The array substrate of claim 4, wherein each of the gate lines comprises a plurality of first sub-gate lines extending along the first direction and a plurality of second sub-gate lines extending along a fifth direction, and wherein the second sub-gate lines overlap the second sub-data lines.

6. The array substrate of claim 5, wherein the fifth direction is the same as the third direction.

7. The array substrate of claim 1, wherein the second sub-data lines are wider than the first sub-data lines.

8. The array substrate of claim 7, wherein the second sub-data lines are wider than the first sub-data lines by 0.1 to 10 μm.

9. The array substrate of claim 7, wherein a length of a boundary line located on a side of the data line and formed between a gate line and a second sub-data line overlapping each other is greater than a width of the gate line.

10. The array substrate of claim 1, wherein each of the gate lines has a thickness of 1 to 3 μm.

11. The array substrate of claim 1, wherein each of the second sub-data lines is longer than a side surface of a pixel.

12. An array substrate for display devices, the array substrate comprising:

a plurality of first lines that extend along a first direction;

a second line that is formed by connecting a plurality of first sub-lines extending along a second direction, a plurality of second sub-lines extending along a third direction, and a plurality of third sub-lines extending along a fourth direction, wherein the first direction and the second direction are perpendicular to each other, and wherein the second sub-lines overlap odd-numbered first lines with an insulating layer interposed therebetween, and the third sub-lines overlap even-numbered first lines with an insulating layer interposed therebetween.

13. The array substrate of claim 12, wherein the first direction and the second direction are perpendicular to each other, and the third and fourth directions are oblique to the first direction and the second direction.

14. The array substrate of claim 12, wherein the first lines correspond to gate lines, and the second line corresponds to a data line.

* * * * *